(12) United States Patent
Jung et al.

(10) Patent No.: US 10,727,207 B2
(45) Date of Patent: Jul. 28, 2020

(54) SEMICONDUCTOR PACKAGING STRUCTURE AND METHOD OF FORMING THE SAME

(71) Applicant: Agency for Science, Technology and Research, Singapore (SG)

(72) Inventors: Boo Yang Jung, Singapore (SG); Jason Au, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 0 days.

(21) Appl. No.: 16/314,485

(22) PCT Filed: Jul. 3, 2017

(86) PCT No.: PCT/SG2017/050334
§ 371 (c)(1),
(2) Date: Dec. 31, 2018

(87) PCT Pub. No.: WO2018/009146
PCT Pub. Date: Jan. 11, 2018

(65) Prior Publication Data
US 2019/0319010 A1    Oct. 17, 2019

(30) Foreign Application Priority Data
Jul. 7, 2016    (SG) .......................... 10201605552 U

(51) Int. Cl.
*H01L 25/065*    (2006.01)
*H01L 21/56*    (2006.01)
(Continued)

(52) U.S. Cl.
CPC ........ *H01L 25/0657* (2013.01); *H01L 21/565* (2013.01); *H01L 21/76877* (2013.01);
(Continued)

(58) Field of Classification Search
CPC . H01L 25/0657; H01L 25/105; H01L 21/565; H01L 21/76877; H01L 23/3142; H01L 23/481; H01L 24/09; H01L 24/32
(Continued)

(56) References Cited

U.S. PATENT DOCUMENTS 5,608,265 A    3/1997    Kitano et al.
7,843,059 B2 *  11/2010    Gomyo ............... H01L 23/3128
                                                257/686
(Continued)

OTHER PUBLICATIONS

Written Opinion of the International Searching Authority for International Application No. PCT/SG2017/050334 dated Sep. 11, 2017, pp. 1-5.
(Continued)

*Primary Examiner* — Dao H Nguyen
(74) *Attorney, Agent, or Firm* — Winstead PC

(57) ABSTRACT

Various embodiments may provide a method of forming a semiconductor packaging structure. The method may include forming a plurality of semiconductor packages, each semiconductor package including a semiconductor die and a mold encapsulation structure. The method may also include arranging the plurality of semiconductor packages to form a vertical stacked arrangement with a mold portion including a plurality of mold encapsulation structures, the mold portion extending from a first side to a second side of the vertical stacked arrangement opposite the first side. The method may additionally include forming a first via on the mold portion at the first side of the vertical stacked arrangement, forming a second via on the mold portion at the second side of the vertical stacked arrangement, and forming an electrically conductive filled via extending through the mold portion from the first side to the second side of the vertical stacked arrangement.

15 Claims, 8 Drawing Sheets

(51) Int. Cl.
*H01L 21/768* (2006.01)
*H01L 23/31* (2006.01)
*H01L 23/48* (2006.01)
*H01L 23/00* (2006.01)

(52) U.S. Cl.
CPC ........ *H01L 23/3142* (2013.01); *H01L 23/481* (2013.01); *H01L 24/09* (2013.01); *H01L 24/32* (2013.01); *H01L 2224/02372* (2013.01)

(58) Field of Classification Search
USPC ....... 257/723, 724, 737, 760, 774, 659, 676, 257/685, 686, 693, 699, E23.01, E23.023, 257/E23.039, E23.043, E23.069, E23.114, 257/E23.124, E21.502, E21.503, E21.504, 257/E21.597, E25.006, E25.013, E25.023, 257/E25.029; 438/106, 107, 109, 667
See application file for complete search history.

(56) References Cited

U.S. PATENT DOCUMENTS

| | | | |
|---|---|---|---|
| 8,895,440 B2 | 11/2014 | Choi et al. | |
| 2006/0043573 A1* | 3/2006 | Hedler | H01L 21/568 257/700 |
| 2008/0036050 A1 | 2/2008 | Lin et al. | |
| 2008/0136004 A1 | 6/2008 | Yang et al. | |
| 2008/0308921 A1* | 12/2008 | Kim | H01L 21/561 257/686 |
| 2010/0246141 A1 | 9/2010 | Leung et al. | |
| 2011/0186992 A1 | 8/2011 | Wu et al. | |
| 2012/0032340 A1 | 2/2012 | Choi et al. | |
| 2012/0217607 A1* | 8/2012 | Hanai | H01L 27/14618 257/448 |
| 2013/0228917 A1 | 9/2013 | Yoon et al. | |
| 2014/0001625 A1 | 1/2014 | Han et al. | |

OTHER PUBLICATIONS

International Preliminary Report on Patentability for International Application No. PCT/SG2017/050334 dated Jun. 6, 2018, pp. 1-24.
Zhang et al., "Heterogeneous 2.5D Integration on Through Silicon Interposer," Applied Physics Reviews, vol. 2, 021308, 2015, pp. 1-58.
Sakuma et al., "An Enhanced Thermo-Compression Bonding Process to Address Warpage in 3D Integration of Large Die on Organic Substrates," 2015 Electronic Components & Technology Conference, 2015, pp. 318-324.
Choonheung Lee, "the Trend of TSV Packaging," SEMATECH Symposium, 2011, pp. 1-24.
Sungdong Cho, "Technical Challenges in TSV Integration to Si," SEMATECH Symposium, Korea, Oct. 27, 2011, pp. 1-33.

* cited by examiner

SEMICONDUCTOR PACKAGING STRUCTURE AND METHOD OF FORMING THE SAME

CROSS-REFERENCE TO RELATED APPLICATION

This application claims the benefit of priority of Singapore application No. 10201605552U filed on Jul. 7, 2016, the contents of it being hereby incorporated by reference in its entirety for all purposes.

TECHNICAL FIELD

Various aspects of this disclosure relate to a semiconductor packaging structure. Various aspects of this disclosure relate to methods of forming a semiconductor packaging structure.

BACKGROUND

Handheld consumer electronics require packaging technologies which are able to provide more compact sizes, higher performance, and/or low costs. These market requirements motivate the transition of the die placement from side by side to die stacking. Also, these requirements encourage the switching of interconnection technologies from wire bonding to vertical interconnections using Through Silicon Vias (TSVs). FIG. 1A is an image 100a showing wirebond stacking. FIG. 1B is an image 100b showing through silicon via (TSV) stacking.

TSV technology has been considered as a promising platform for 3D stacking as well 2.5D interposer to accommodate high input/output (I/O) and smaller form factor. However, this technology may still be considered as a high cost process due to relative expensive front-end process such as dual damascene, deep reactive-ion etching (DRIE) etching, chemical vapor deposition (CVD) etc.

FIG. 2 is a schematic 200 showing process flow of through silicon via (TSV) die stacking. "FEOL" refers to Front End of Line and "BEOL" refers to Back End of Line. "C4 bump formation" refers to controlled collapse chip connection bump formation or flip chip bump formation. The process flow may include 3 main processes: fab wafer process, post fab wafer process, and assembly and packaging process. The conventional die stacking process using TSV includes Back End of Line (BEOL) processing methods such as deep reactive-ion etching (DRIE), chemical vapor deposition (CVD) and plating, as well as packaging methods such as bumping, backgrinding, Temporary Bonding Debonding (TBDB), and thermal compression bonding.

SUMMARY

Various embodiments may provide a method of forming a semiconductor packaging structure. The method may include forming a plurality of semiconductor packages, each semiconductor package including a semiconductor die and a mold encapsulation structure covering at least a portion of the semiconductor die. The method may also include arranging the plurality of semiconductor packages to form a vertical stacked arrangement with a mold portion including a plurality of mold encapsulation structures, the mold portion extending from a first side of the vertical stacked arrangement to a second side of the vertical stacked arrangement opposite the first side. The method may additionally include forming a first via on the mold portion at the first side of the vertical stacked arrangement after the vertical stacked arrangement is formed. The method may also include forming a second via on the mold portion at the second side of the vertical stacked arrangement after forming the first via. The method may further include forming an electrically conductive filled via extending through the mold portion from the first side of the vertical stacked arrangement to the second side of the vertical stacked arrangement by depositing a suitable electrically conductive material in the first via and in the second via. A diameter of the electrically conductive filled via at the first side of the vertical stacked arrangement may be greater than a diameter of the electrically conductive filled via along an intervening plane of the vertical stacked arrangement, the intervening plane between the first side of the vertical stacked arrangement and the second side of the vertical stacked arrangement. Further, a diameter of the electrically conductive filled via at the second side of the vertical stacked arrangement may be greater than the diameter of the electrically conductive filled via along the intervening plane of the vertical stacked arrangement.

Various embodiments may provide a semiconductor packaging structure according to various embodiments. The semiconductor packaging structure may include or may be a vertical stacked arrangement including a plurality of semiconductor packages, each semiconductor package including a semiconductor die and a mold encapsulation structure covering at least a portion of the semiconductor die. The vertical stacked arrangement may include a mold portion including a plurality of the mold encapsulation structures, the mold portion extending from a first side of the vertical stacked arrangement to a second side of the vertical stacked arrangement opposite the first side. The mold portion may include an electrically conductive filled via extending though the mold portion from the first side of the vertical stacked arrangement to the second side of the vertical stacked arrangement, the electrically conductive filled via including a suitable electrically conductive material. A diameter of the electrically conductive filled via at the first side of the vertical stacked arrangement may be greater than a diameter of the electrically conductive filled via along an intervening plane of the vertical stacked arrangement, the intervening plane between the first side of the vertical stacked arrangement and the second side of the vertical stacked arrangement. Further, a diameter of the electrically conductive filled via at the second side of the vertical stacked arrangement may be greater than the diameter of the electrically conductive filled via along the intervening plane of the vertical stacked arrangement.

BRIEF DESCRIPTION OF THE DRAWINGS

The invention will be better understood with reference to the detailed description when considered in conjunction with the non-limiting examples and the accompanying drawings, in which.

DETAILED DESCRIPTION

Figure 1A:
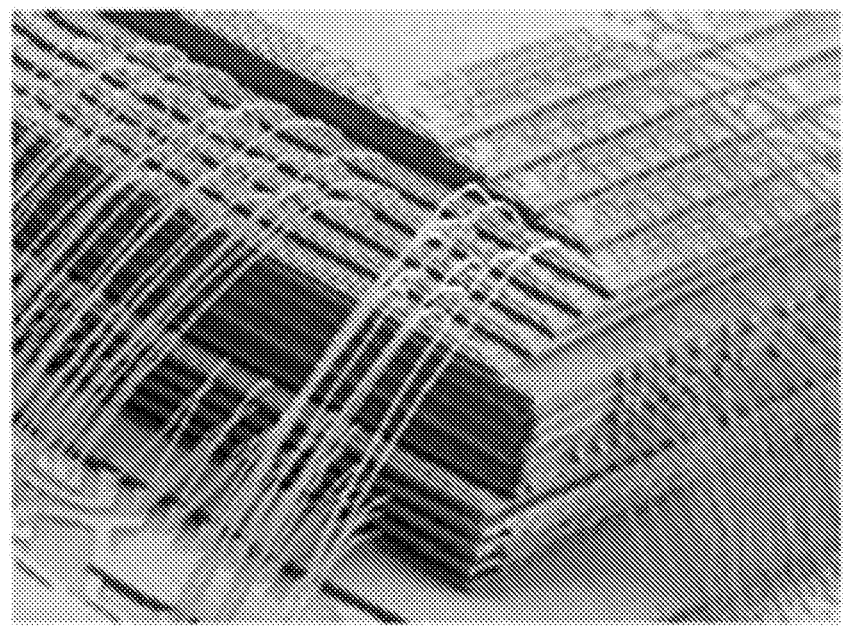
FIG. 1A is an image showing wirebond stacking.
Figure 1B:
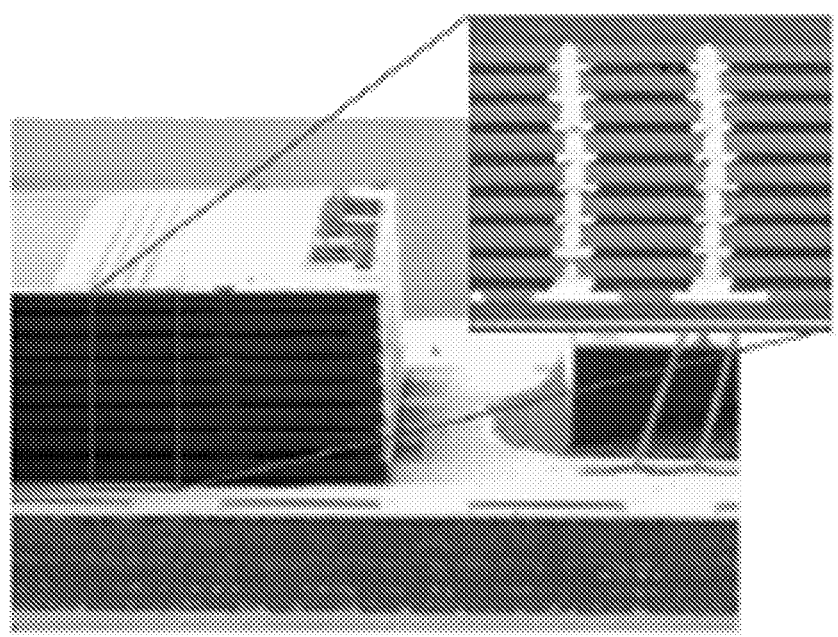
FIG. 1B is an image showing through silicon via (TSV) stacking.
Figure 2:
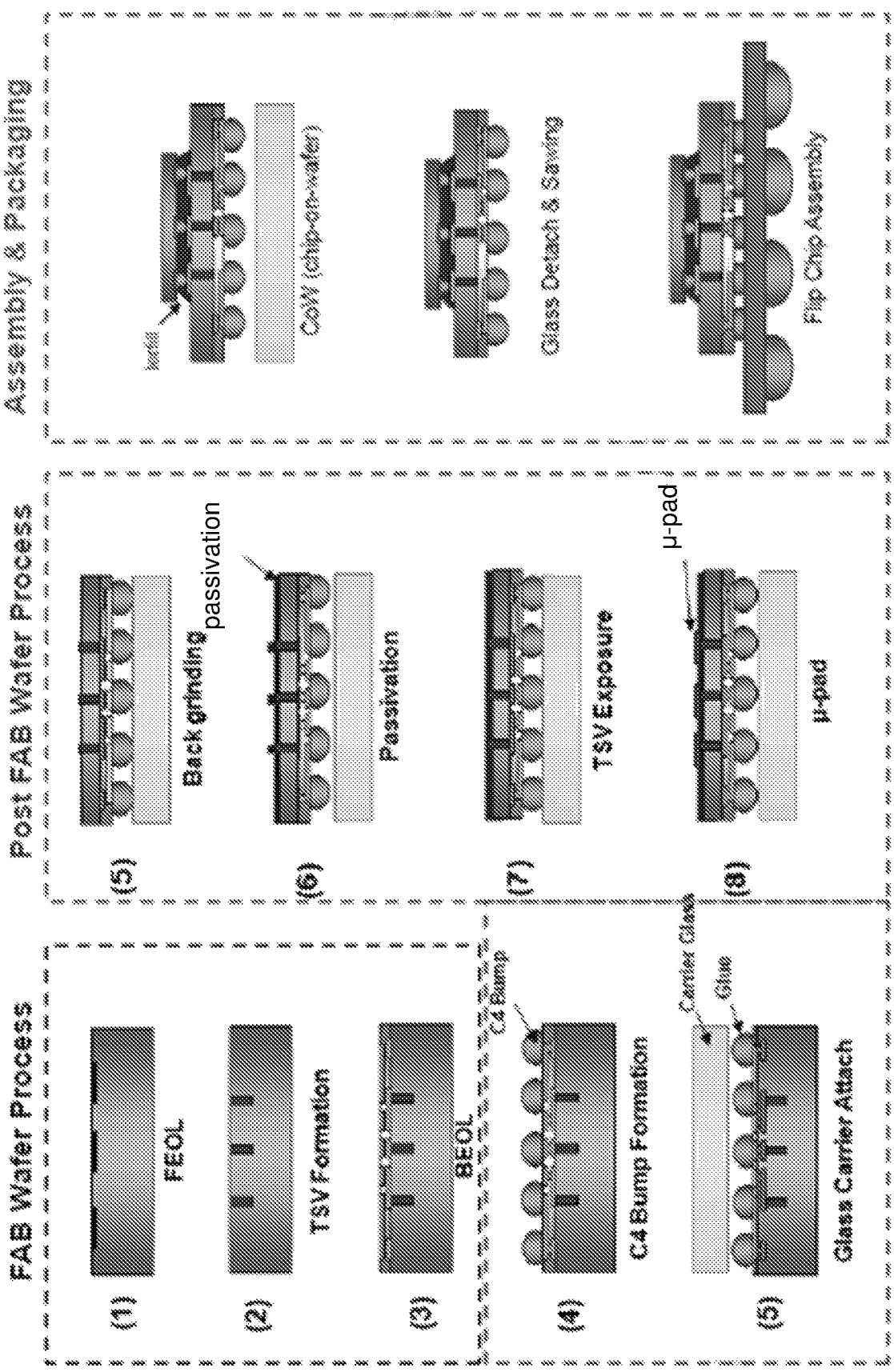
FIG. 2 is a schematic showing process flow of through silicon via (TSV) die stacking.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or one of the semiconductor packaging structures is analogously valid for the other methods or semiconductor packaging structures. Similarly, embodiments described in the context of a method are analogously valid for a semiconductor packaging structure, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Various embodiments may relate to die stacking processes and/or structures formed by fan out wafer level package process using through mold via (TMV). A TSV structure may be replaced by TMV using Fanout redistribution layer (RDL) processes.

Various embodiments may seek to address the issues faced by conventional TSV die stacking. Various embodiments may lead to lower costs compared to conventional TSV die stacking.

Figure 3:
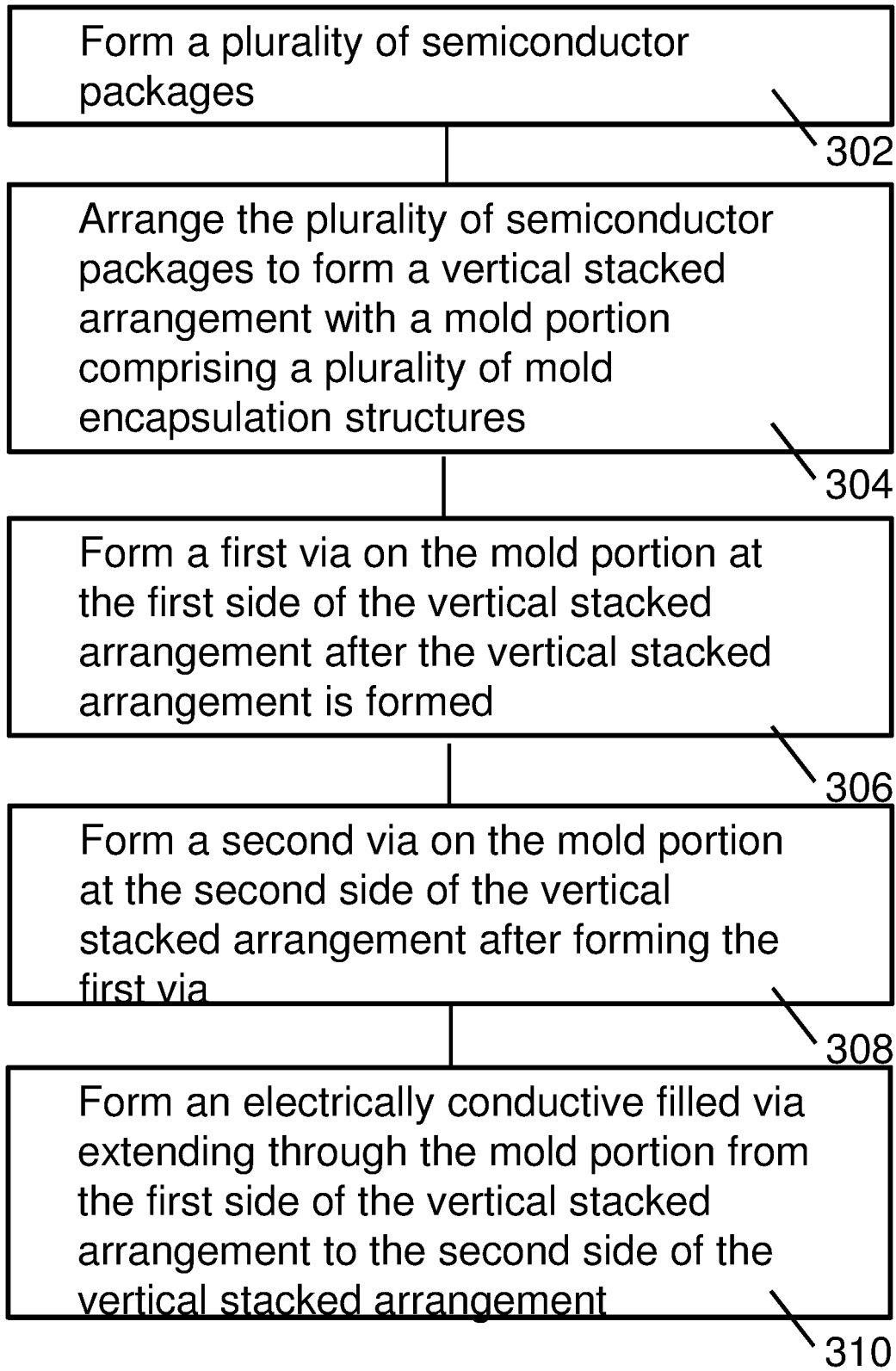
FIG. 3 is a schematic showing a method of forming a semiconductor packaging structure according to various embodiments.

FIG. 3 is a schematic 300 showing a method of forming a semiconductor packaging structure according to various embodiments. The method may include, in 302, forming a plurality of semiconductor packages, each semiconductor package including a semiconductor die and a mold encapsulation structure covering at least a portion of the semiconductor die. The method may also include, in 304, arranging the plurality of semiconductor packages to form a vertical stacked arrangement with a mold portion including a plurality of mold encapsulation structures, the mold portion extending from a first side of the vertical stacked arrangement to a second side of the vertical stacked arrangement opposite the first side. The method may additionally include, in 306, forming a first via on the mold portion at the first side of the vertical stacked arrangement after the vertical stacked arrangement is formed. The method may also include, in 308, forming a second via on the mold portion at the second side of the vertical stacked arrangement after forming the first via. The method may further include, in 310, forming an electrically conductive filled via extending through the mold portion from the first side of the vertical stacked arrangement to the second side of the vertical stacked arrangement by depositing a suitable electrically conductive material in the first via and in the second via. A diameter of the electrically conductive filled via at the first side of the vertical stacked arrangement may be greater than a diameter of the electrically conductive filled via along an intervening plane of the vertical stacked arrangement, the intervening plane between the first side of the vertical stacked arrangement and the second side of the vertical stacked arrangement. Further, a diameter of the electrically conductive filled via at the second side of the vertical stacked arrangement may be greater than the diameter of the electrically conductive filled via along the intervening plane of the vertical stacked arrangement.

In other words, the method may include encapsulating each of a plurality of semiconductor die with a mold compound so that each semiconductor die is covered at least partially by the mold compound to form a plurality of semiconductor packages. The method may further include stacking the plurality of semiconductor packages to form a vertically stacked arrangement such that mold compound of the semiconductor packages are vertically aligned with one another. The method may further include forming vias by removing mold compound from vertically opposing sides of the vertically stacked arrangement, wherein the vias taper from the opposing sides to a smaller diameter in a middle portion of the vertically stacked arrangement.

The semiconductor packaging structure may also be referred to as a stacked arrangement or an arrangement of semiconductor packages or a multi-package arrangement/structure.

The mold encapsulation structure(s) may include a suitable mold compound such as epoxy polymers, epoxy resin, polyester resin, vinyl ester, or silicone.

In various embodiments, each semiconductor package further may include a redistribution layer on or over the semiconductor die. The redistribution layer may extend from over the semiconductor die to on or over the mold encapsulation structure. The redistribution layer may include one or more electrically conductive lines. The one or more electrically conductive lines may be in electrical connection with the electrically conductive filled via. The one or more electrically conductive lines may be in electrical connection with the semiconductor die. In other words, the redistribution layer of each semiconductor package may electrically connect the semiconductor die of each package with the electrically filled via in each package. The redistribution layer may include one or more redistribution layer vias, i.e. via present in the redistribution layer, electrically connecting the one or more electrically conductive lines. A redistribution layer via may electrically connect a first conductive line and a second conductive line of the one or more electrically conductive lines.

In various embodiments, the redistribution layer may further include one or more dielectric layers. The one or more electrically conductive lines may be embedded in or may be at least be partially covered by the one or more dielectric layers. A dielectric layer may be between two electrically conductive lines, i.e. between the first conductive line and the second conductive line. The redistribution layer via may extend from a first side of the dielectric layer to a second side of the dielectric layer to electrically connect the first conductive line and a second conductive line.

Each semiconductor package of the vertically stacked arrangement may be different. A first semiconductor package of the arrangement may be different from a second semiconductor package of the arrangement. For instance, each package within the stack may contain unique and heterogeneous redistribution layer designs. The pattern of conductive lines in the redistribution layer of a first semiconductor package may be different from the pattern of conductive lines in the redistribution layer of a second semiconductor package. The thickness of the conductive lines in the redistribution layer of the first semiconductor package may be different from the thickness of the conductive lines in the redistribution layer of the second semiconductor package. The semiconductor die included in a first semiconductor package may be different from the semiconductor die included in a second semiconductor package. For instance, the semiconductor die included in the first package may have a size and/or thickness different from a size and/or thickness of the semiconductor die included in the second package. A first semiconductor package may have a thickness different from a thickness of a second semiconductor package.

Forming the vertical stacked arrangement may include applying adhesive to adhere neighbouring semiconductor packages of the vertical stacked arrangement. The adhesive may be applied on the mold encapsulation structure, the semiconductor die, and/or the redistribution layer of each package so that an adhesive layer formed may be in contact with the mold encapsulation structure, the semiconductor die, and/or the redistribution layer of each package.

Forming the first via may include laser drilling the mold portion at the first side of the vertical stacked arrangement. Forming the second via may also include laser drilling the mold portion at the second side of the vertical stacked arrangement. The method may include laser drilling the mold portion at the first side of the vertical stacked arrangement to form the first via, followed by laser drilling the mold portion at the second side of the vertical stacked arrangement to form the second via. Laser drilling may refer to a process of directing laser energy at a material, i.e. the mold portion, until a hole is created.

In various embodiments, the electrical conductive filled via may include a redistribution layer or a portion of a redistribution layer. The electrically conductive material in the first via may be in contact with a first side of the redistribution layer or the portion of the redistribution layer, and the electrically conductive material in the second via may be in contact with a second side of the redistribution layer or the portion of the redistribution layer opposite the first side. One or more electrically conductive lines in the redistribution layer or portion of the redistribution layer may connect the electrically conductive material in the first via and the electrically conductive material in the second via.

The first via and the second via may be aligned with each other so that a central axis of the first via coincides with a central axis of the second via. A central axis of a via may be defined as an axis of the via passing through an entire length of the via. At each plane parallel to the intervening plane (and/or the surface at the first side of the vertical stacked arrangement and/or the surface at the second side of the vertical stacked arrangement), a first radius connecting the point of the axis to a first point of the side wall of the via may substantially be equal to a second radius connecting the point of the axis to a second point of the side wall of the via different from the first point. The central axis of the first via and the central axis of the second via may pass through the intervening plane and/or the surface at the first side of the vertical stacked arrangement and/or the surface at the second side of the vertical stacked arrangement at right angles.

In various other embodiments, the second via may meet or connect with the first via. The first via and the second via may form a continuous through mold via.

The electrically conductive filled via or continuous through mold via may taper from the opposing sides to a middle portion of the vertically stacked arrangement, the middle portion between the first side and the second side of the vertically stacked arrangement. In other words, the diameter of the electrically conductive filled via or the continuous through mold via at the sides of the vertically stacked arrangement may be greater than the diameter of the electrically conductive filled via or the continuous through mold via in the middle of the vertically stacked arrangement. The middle portion may or may not include a redistribution layer or a portion of the redistribution layer.

The electrically conductive filled via may include a first tapered portion extending from the first side of the vertical stacked arrangement to the middle portion or intervening plane of the vertical stacked arrangement. The first via formed by laser drilling may be or may include the first tapered portion. The electrically conductive filled via may include a second tapered portion extending from the second side of the vertical stacked arrangement to the middle portion or intervening plane of the vertical stacked arrangement. The second via formed by laser drilling may be or may include the second tapered portion. In other words, the first tapered portion and the second tapered portion may face each other. The middle portion or intervening plane may be where the second via meets or connects with the first via, or where the redistibution layer or portion of distribution in contact with the first tapered portion and the second tapered portion lies. The tapered portions may arise due to laser drilling on opposing sides of the vertical stacked arrangement.

In various embodiments, the suitable electrically conductive material may be deposited in the first via and the second via by electroplating. The suitable electrically conductive material may be copper, or any other suitable metal. In various other embodiments, the suitable electrically conductive material may be deposited in the first via and the second via by electroless plating.

Electroplating may include forming a seed layer on the sidewalls of the first via and/or the second via, introducing a solution including suitable metal cations of the suitable electrically conductive material (e.g. copper cations or cations of any suitable metal) to the seed layer, and applying an electric current through the solution using the seed layer as the cathode and an other electrode as the anode so that the metal cations are deposited onto the seed layer.

In various other embodiments, the suitable electrically conductive material may be deposited in the first via and the second via by screen printing. The electrically conductive material may be conductive epoxy.

Various embodiments may relate to a semiconductor arrangement formed by any method described herein.

Figure 4:
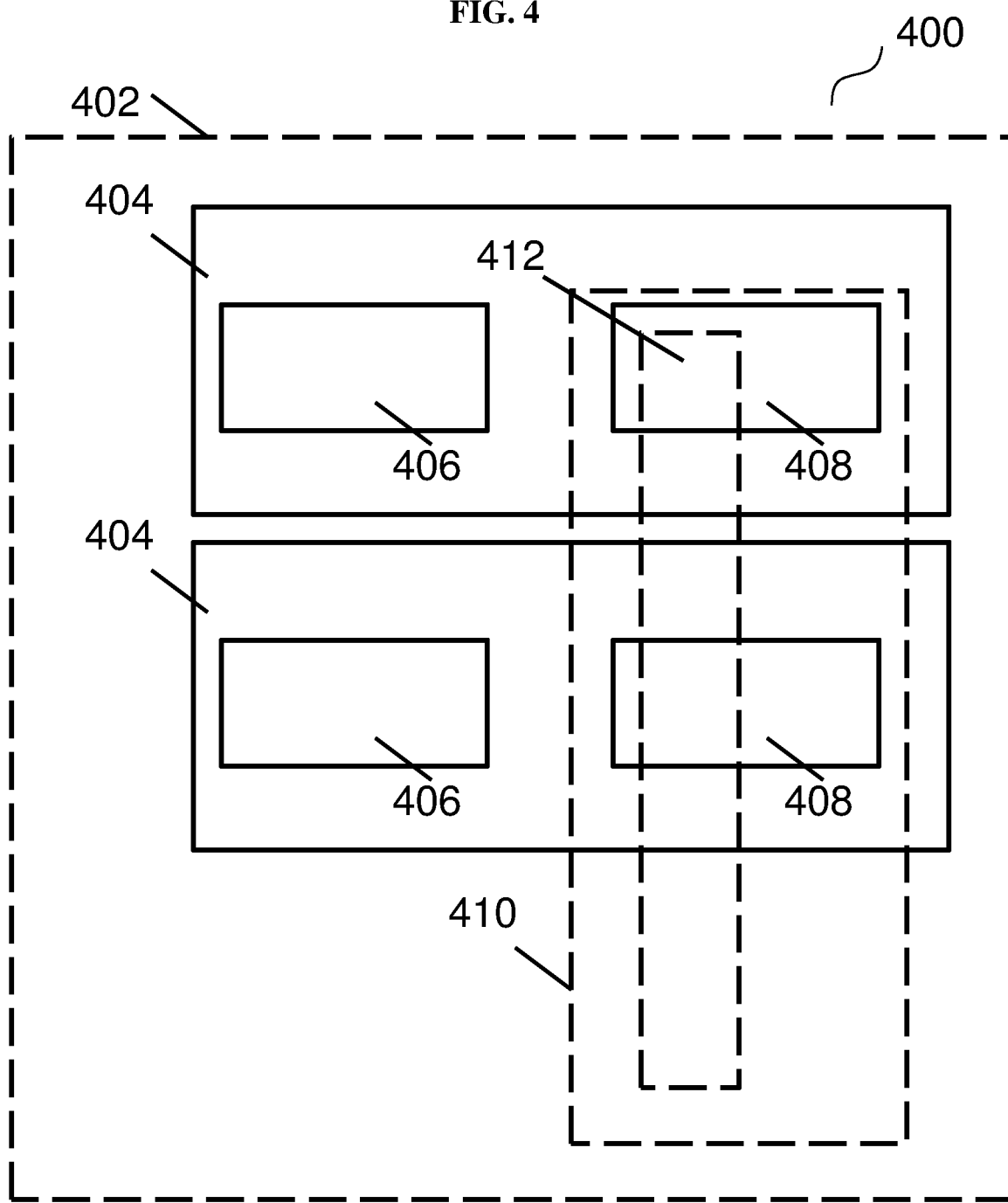
FIG. 4 shows a general illustration of a semiconductor packaging structure according to various embodiments.

FIG. 4 shows a general illustration of a semiconductor packaging structure 400 according to various embodiments. The semiconductor packaging structure 400 may be or may include a vertical stacked arrangement 402 including a plurality of semiconductor packages 404, each semiconductor package 404 including a semiconductor die 406 and a mold encapsulation structure 408 covering at least a portion of the semiconductor die 406. The vertical stacked arrangement 402 may include a mold portion 410 including a plurality of the mold encapsulation structures 408, the mold portion 410 extending from a first side of the vertical stacked arrangement 402 to a second side of the vertical stacked arrangement 402 opposite the first side. The mold portion 410 may include an electrically conductive filled via 412 extending though the mold portion 410 from the first side of the vertical stacked arrangement 402 to the second side of the vertical stacked arrangement 402, the electrically conductive filled via 412 including a suitable electrically conductive material. A diameter of the electrically conductive filled via 412 at the first side of the vertical stacked arrangement 402 may be greater than a diameter of the electrically conductive filled via 412 along an intervening plane of the vertical stacked arrangement 402, the intervening plane between the first side of the vertical stacked arrangement 402 and the second side of the vertical stacked arrangement 402. Further, a diameter of the electrically conductive filled via 412 at the second side of the vertical stacked arrangement 402 may be greater than the diameter of the electrically conductive filled 412 via along the intervening plane of the vertical stacked arrangement 402.

In other words, the arrangement 400 may be a vertical stacked arrangement 402 including more than one encapsulated semiconductor dies 406, with the mold encapsulation structures 408 aligned vertically with respect to one another. A filled via 412 may be formed extending through the mold portion 412 of the arrangement 402, the diameter of the via 412 at the sides greater than the diameter of the via 412 in the middle.

For avoidance of doubt, while FIG. 4 illustrates two packages 404, various embodiments may include more than two packages 404, each package 404 including a semiconductor die 406 and a mold encapsulation structure 408.

In various embodiments, the vertical stacked arrangement 402 may further include a redistribution layer between the semiconductor dies 406 of neighbouring semiconductor packages 404 of the vertical stacked arrangement 402. The redistribution layer may further extend from between the semiconductor dies 406 to between the mold encapsulation structures 408 of neighbouring semiconductor packages 404 of the vertical stacked arrangement 402. The redistribution layer may be between neighbouring semiconductor packages 404. In various embodiments, the redistribution layer may be on a semiconductor die 406, and/or a mold encapsulation structure 408.

The redistribution layer may include one or more electrically conductive lines. The one or more electrically conductive lines may be in electrical connection with the electrically conductive filled via 412. The one or more electrically conductive lines may be in electrical connection with the semiconductor die 406. In other words, the redistribution layer of each semiconductor package may electrically connect the semiconductor die 406 of each package 404 with the electrically filled via in each package 404. The redistribution layer may include one or more redistribution layer vias, i.e. via present in the redistribution layer, electrically connecting the one or more electrically conductive lines. A redistribution layer via may electrically connect a first conductive line and a second conductive line of the one or more electrically conductive lines.

In various embodiments, the redistribution layer may further include one or more dielectric layers. The one or more electrically conductive lines may be embedded in or may be at least be partially covered by the one or more dielectric layers. A dielectric layer may be between two electrically conductive lines, i.e. between the first conductive line and the second conductive line. A redistribution layer via may extend from a first side of the dielectric layer to a second side of the dielectric layer to electrically connect the first conductive line and a second conductive line.

In various embodiments, the vertical stacked arrangement 402 may include a plurality of redistribution layers.

In various embodiments, the vertical stacked arrangement 402 may further include an adhesive layer between neighbouring semiconductor packages 404 of the vertical stacked arrangement 402. The adhesive layer may be in contact with the two neighbouring semiconductor packages. The adhesive layer may be configured to adhere the two neighbouring semiconductor packages 404. The adhesive layer may be on a semiconductor package 404, and may at least partially cover a redistribution layer and/or a semiconductor die 406.

The intervening plane of the vertical stacked arrangement 402, a surface of the first side of the vertical stacked arrangement 402, and a surface of the second side of the vertical stacked arrangement 402 may be substantially parallel to one another.

The electrically conductive filled via 412 may include a first tapered portion extending from the first side of the vertical stacked arrangement 402 to the middle portion or intervening plane of the vertical stacked arrangement 402. The electrically conductive filled via 412 may include a second tapered portion extending from the second side of the vertical stacked arrangement 402 to the middle portion or intervening plane of the vertical stacked arrangement 402.

In various embodiments, the suitable electrically conductive material may be a metal such as copper.

Figure 5:
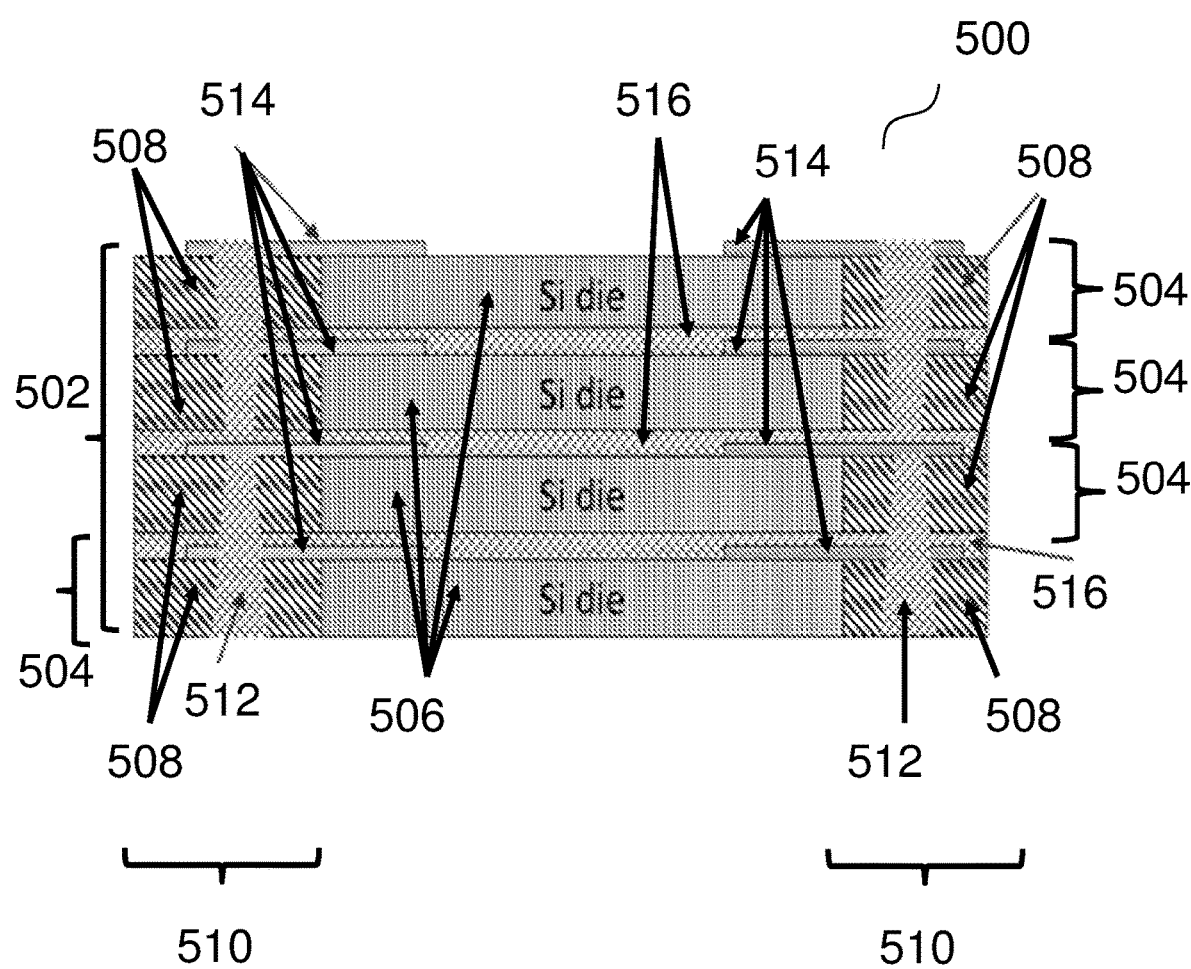
FIG. 5 shows a cross-sectional side view of a semiconductor arrangement according to various embodiments.

FIG. 5 shows a cross-sectional side view of a semiconductor arrangement 500 according to various embodiments.

The semiconductor arrangement 500 may include a vertical stacked arrangement 502 including a plurality of semiconductor packages 504, each semiconductor package 504 including a semiconductor die 506 and a mold encapsulation structure 508 covering at least a portion of the semiconductor die. The vertical stacked arrangement 502 may include one or more mold portions 510, each of the one or more mold portions 510 including a plurality of the mold encapsulation structures 508, the mold portion 510 extending from a first side of the vertical stacked arrangement 502 to a second side of the vertical stacked arrangement 502 opposite the first side. The mold portion 510 may include one or more electrically conductive filled vias 512 extending though the one or more mold portions 510 from the first side of the vertical stacked arrangement 502 to the second side of the vertical stacked arrangement 502, the one or more electrically conductive filled vias 512 including a suitable electrically conductive material. A diameter of each of the one or more electrically conductive filled vias 512 at the first side of the vertical stacked arrangement 502 may be greater than a diameter of the electrically conductive filled via 512 along an intervening plane of the vertical stacked arrangement 502, the intervening plane between the first side of the vertical stacked arrangement 502 and the second side of the vertical stacked arrangement 502. Further, a diameter of the electrically conductive filled via 512 at the second side of the vertical stacked arrangement 502 may be greater than the diameter of the electrically conductive filled 512 via along the intervening plane of the vertical stacked arrangement 502.

Various embodiments may relate to dimensional (3D) stacking using fanout wafer level package and Through Mold Via (TMV) process. The vertical interconnections 512, i.e. the electrically conductive filled vias 512, for 3D stacking may be formed in the mold area 510 instead of silicon (Si) area. As seen from FIG. 5, each mold portion 510 may include an electrically conductive filled via 512 extending from the first side of the vertical stacked arrangement 502 to the second side of the vertical stacked arrangement 502. The mold portion 510 may include a plurality of the mold encapsulation structures 508, with neighboring mold encapsulation structures 508 separated by a redistribution layer (RDL) 514 and an adhesive layer 516. The mold encapsulation structures 508 in the mold portion 510 may be aligned for forming the vertical interconnections 512. The mold encapsulation structures may be aligned so that at least a portion of a top encapsulation structure 508 overlaps with at least a portion of a bottom encapsulation structure 508. The semiconductor dies 506 may also be aligned, i.e. at least a portion of a top semiconductor die 506 overlaps with at least a portion of a bottom semiconductor die 506.

Each die 506 may be processed with fanout wafer level package process like molding. Redistribution layers (RDLs) 514 may redistribute the pad from silicon (Si) die 506 area to mold area 510. Once the fanout wafer level package 504 is formed, each package 504 may be stacked using adhesive material. The adhesive layers 516 including the adhesive material may adhere neighbouring semiconductor packages 504 together. The vertical interconnection 512 may be formed using laser drilling on mold area 508 and plating on the laser-drilled vias. Laser drilling may be carried out from both the top side and the bottom side so that the diameter of the vias at the middle is smaller than the diameters at the top and bottom sides.

The semiconductor packaging structure 500 may have multiple die connections via an electrically conductive filled via or vertical connection 512. Each vertical connection 512 may be electrically connected to multiple dies 506. The vertical connection 512 may include a portion of a redistribution layer 516. Conductive lines and/or vias in the redistribution layer 516 may connect a top portion of the electrically conductive filled via 512 with a bottom portion of the electrically conductive filled via 512.

Figure 6A:
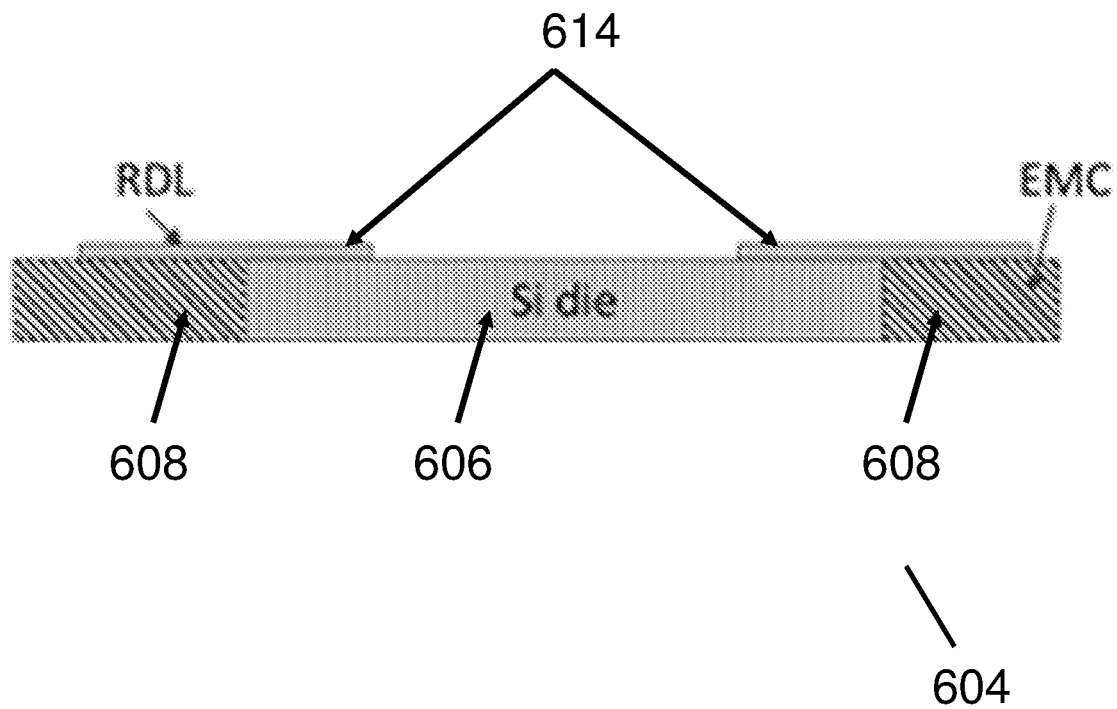
FIG. 6A is a cross-sectional side view showing encapsulation of a semiconductor die, such as a silicon (Si) die according to various embodiments.

FIGS. 6A-F show a method of forming a semiconductor packaging structure according to various embodiments. FIG. 6A is a cross-sectional side view showing encapsulation of a semiconductor die 606, such as a silicon (Si) die according to various embodiments. The semiconductor die 606 may be encapsulated with a mold compound to form a mold encapsulation structure 608 at least covering a portion of the semiconductor die 606. One or more redistribution layers (RDL) 614 may be formed extending over the die 606 and the mold encapsulation structure 608 to form a semiconductor package 604. Each die 606 may be processed with fanout wafer level package process like molding, as well as RDL to redistribute the pad from the semiconductor die area to mold area.

Figure 6B:
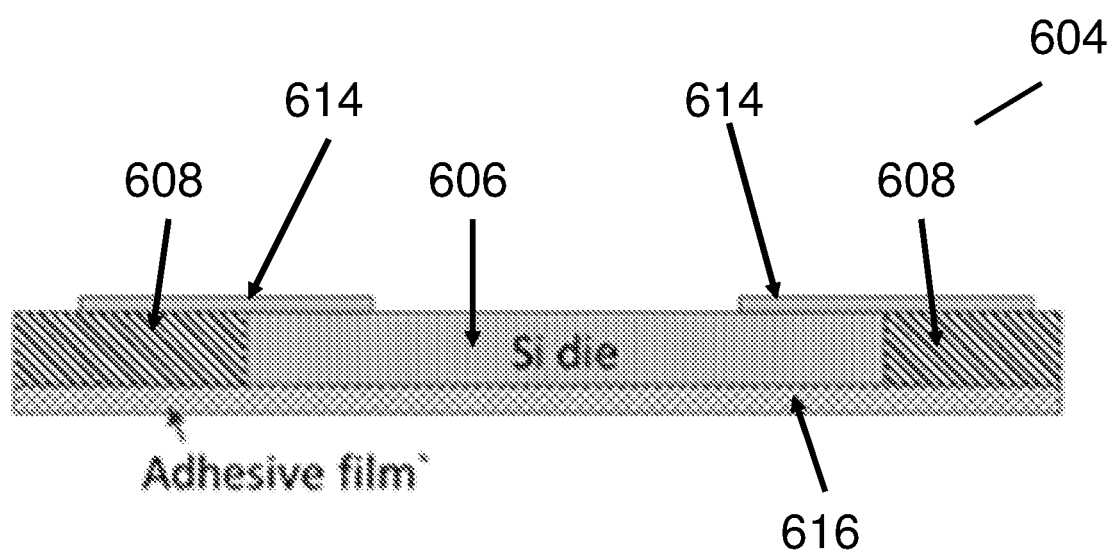
FIG. 6B is a cross-sectional side view showing adhesive being applied on the semiconductor package including the die, mold encapsulation structure and the redistribution layer according to various embodiments.

FIG. 6B is a cross-sectional side view showing adhesive being applied on the semiconductor package 604 including the die 606, mold encapsulation structure 608 and the redistribution layer 614 according to various embodiments. The adhesive may be applied on the semiconductor package 604 to form an adhesive layer 616 so that the adhesive layer 616 may be in contact with a side of the die 606 and the mold encapsulation structure 608 opposite to a side in contact with the redistribution layer 614.

Figure 6C:
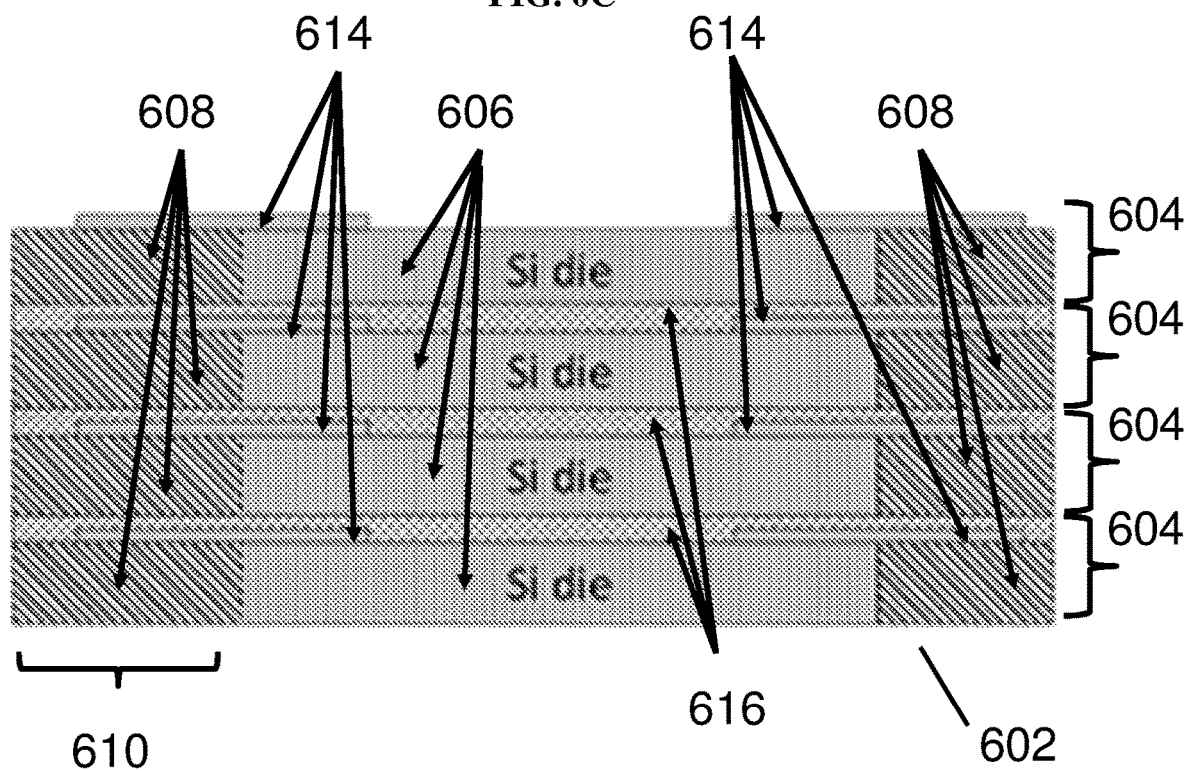
FIG. 6C is a cross-sectional side view showing stacking of multiple semiconductor packages according to various embodiments.

After the fanout wafer level package is formed, the packages may be stacked using the adhesive material. FIG. 6C is a cross-sectional side view showing stacking of multiple semiconductor packages 604 according to various embodiments. A first semiconductor package 604, i.e. a top package 604, may be stacked over a second semiconductor package 604, i.e. a bottom package 604, in such a manner that the adhesive layer 616 of the first semiconductor package 604 may be in contact with the redistribution layer 614 of the second semiconductor package 604 so as to adhere the first semiconductor package 604 to the second semiconductor package 604. The adhesive layer 616 of the first semiconductor package 604 may also be in contact with the die 606 and mold encapsulation structure 608 of the second semiconductor package 604. The bottom most package 604 may not have an adhesive layer under the die 606 and the mold encapsulation structure 608. The multiple semiconductor packages 604 may be stacked to form a vertical stacked arrangement 602. A mold portion 610 including a plurality of aligned mold encapsulation structures 610 may also be formed. The mold portion 610 may also include portions of adhesive layers 616 and/or redistribution layers 614 between the mold encapsulation structures 610. The semiconductor dies 606 may be surrounded by the mold portion 610. For the sake of clarity, only the mold portion 610 on one side of the semiconductor dies 606 has been labelled.

Figure 6D:
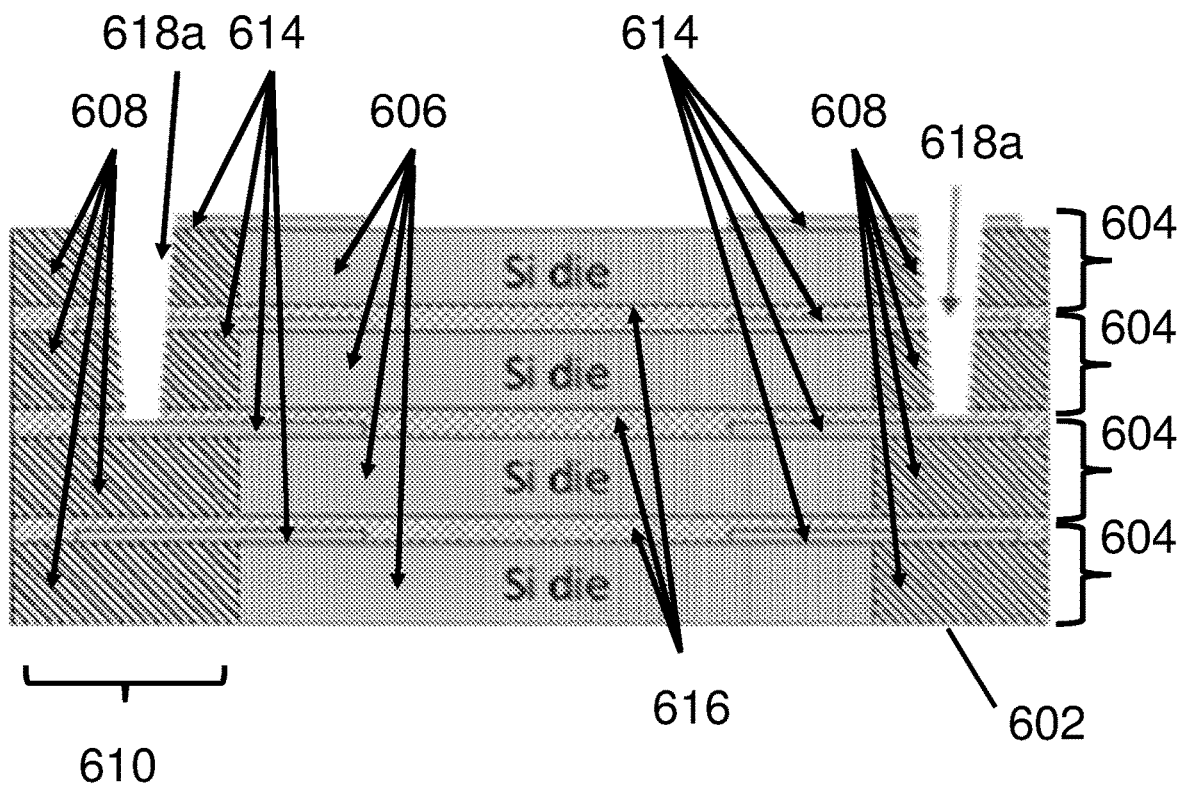
FIG. 6D is a cross-sectional side view showing forming of first vias on mold portions of the vertical stacked arrangement according to various embodiments.
Figure 6E:
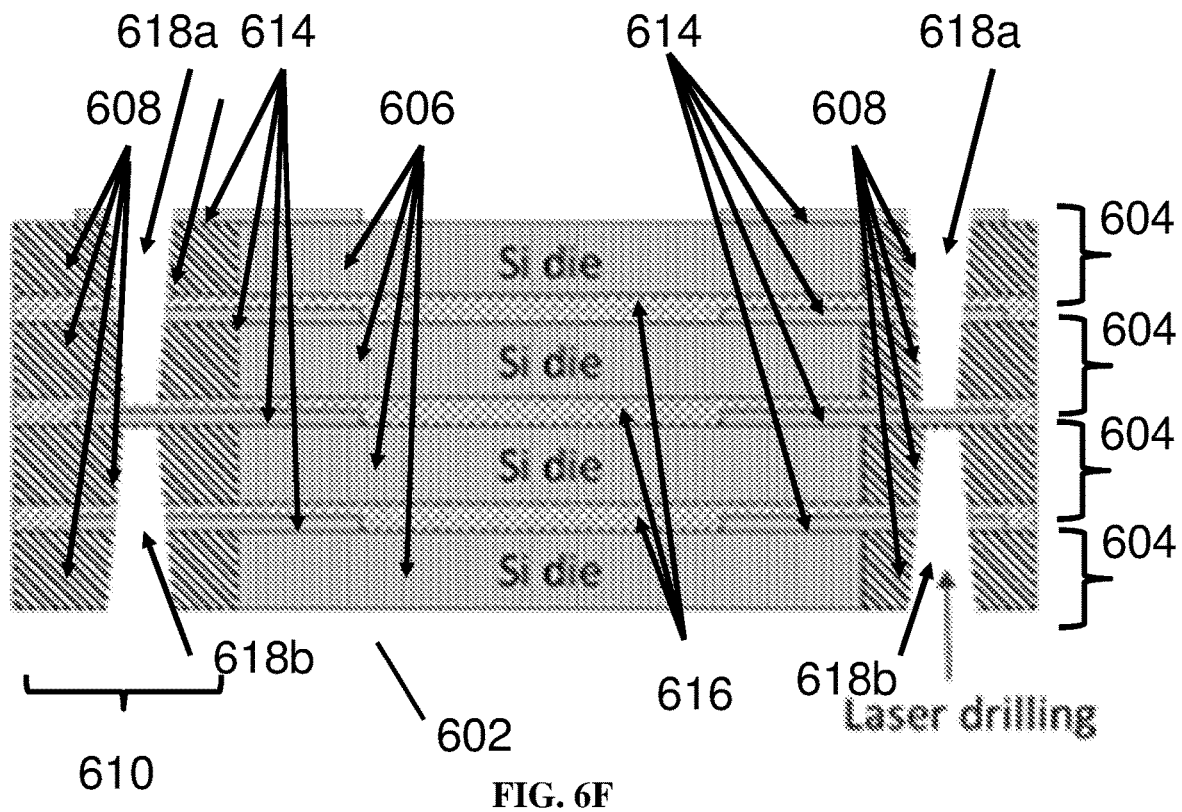
FIG. 6E is a cross-sectional side view showing forming of second vias on mold portions of the vertical stacked arrangement according to various embodiments.

FIG. 6D is a cross-sectional side view showing forming of first vias 618a on mold portions 610 of the vertical stacked arrangement 602 according to various embodiments. The first vias 618a may be formed by laser drilling. FIG. 6E is a cross-sectional side view showing forming of second vias 618b on mold portions 610 of the vertical stacked arrangement 602 according to various embodiments. The second vias 618b may also be formed by laser drilling. The laser drilling on both sides of the vertical stacked arrangement 602 may remove material from the mold encapsulation structures 610 as well as portions of adhesive layers 616 and/or redistribution layers 614 to form the vias 618a, 618b. As shown in FIG. 6E, there may still be a redistribution layer 614 remaining between the first via 618a and the second via 618b after laser drilling.

The locations of the drilled vias 618a, 618b may be different due to dies 616 of each package layer in the stacked arrangement having different functionalities. It may also be envisioned that some vias may not be required for certain applications. For instance, it may be envisioned that one or more vias 618b may not be absent.

Figure 6F:
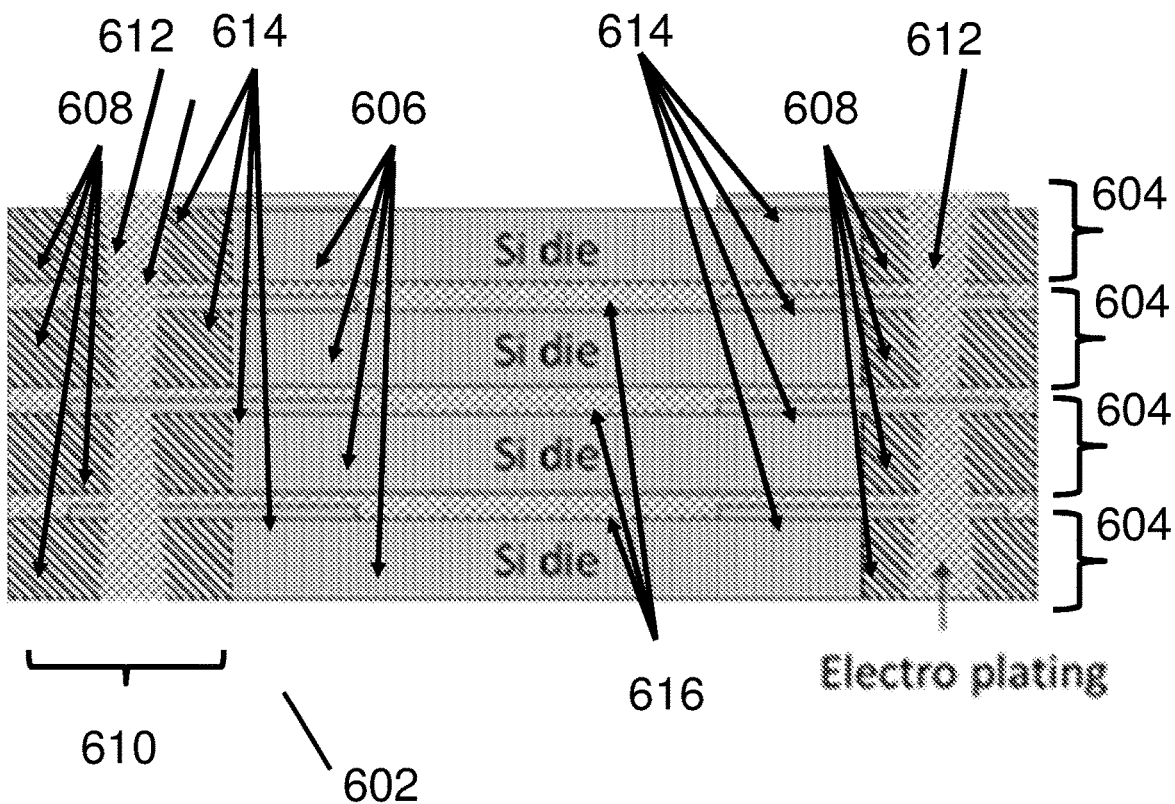
FIG. 6F is a cross-sectional side view showing forming of electrically conductive filled vias according to various embodiments.

FIG. 6F is a cross-sectional side view showing forming of electrically conductive filled vias 612 according to various embodiments. The electrically filled vias 612 may be formed by electroplating metal in the first vias 618a and the second vias 618b.

The electrically conductive filled vias 612 may be formed using laser drilling on mold area 610 and plating on laser-drilled vias 618a, b. Laser drilling may be used for formation of electrically conductive filled vias 612 from top side and bottom side to make smaller via size because vias 618a, b formed by laser drilling are tapered. In various other embodiments, a suitable electrically conductive material such as conductive epoxy may be deposited in the first via 618a and the second via 618b by screen printing.

The conductive line(s) and/or via(s) in the redistribution layer 614 remaining between the first via 618a and the second via 618b may electrically connect the top portion and the bottom portion of the electrically conductive filled via 612 formed.

Various embodiments may have advantages over conventional packages or structures. For instance, multiple stacking may be possible using through mold vias (TMVs). Various embodiments may involve lower processing costs. Smaller vertical interconnections may be possible using laser drilling. However, it may be difficult to form fine patterns, e.g. by using through silicon vias (TSVs).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method of forming a semiconductor packaging structure, the method comprising:

forming a first semiconductor package, a second semiconductor package, a third semiconductor package, and a fourth semiconductor package, each of the first semiconductor package, the second semiconductor package, the third semiconductor package, and the fourth semiconductor package comprising a semiconductor die, a mold encapsulation structure covering at least a portion of the semiconductor die, and a redistribution layer over the semiconductor die;

arranging the first semiconductor package, the second semiconductor package, the third semiconductor package, and the fourth semiconductor package to form a vertical stacked arrangement with a mold portion comprising a plurality of mold encapsulation structures, the mold portion extending from a first side of the vertical stacked arrangement to a second side of the vertical stacked arrangement opposite the first side; wherein a first adhesive layer in contact with a bottom side of the second semiconductor package is also in contact with the redistribution layer of the first semiconductor package so that the first adhesive layer adheres the first semiconductor package to the second semiconductor package; wherein a second adhesive layer in contact with a bottom side of the third semiconductor package is also in contact with the redistribution layer of the second semiconductor package so that the second adhesive layer adheres the second semiconductor package to the third semiconductor package; and wherein a third adhesive layer in contact with a bottom side of the fourth semiconductor package is also in contact with the redistribution layer of the third semiconductor package so that the third adhesive layer adheres the third semiconductor package to the fourth semiconductor package;

forming a first via on the mold portion at the first side of the vertical stacked arrangement after the vertical stacked arrangement is formed;

forming a second via on the mold portion at the second side of the vertical stacked arrangement after forming the first via, the second via meeting the first via to form a continuous through mold via; and forming an electrically conductive filled via extending through the mold portion from the first side of the vertical stacked arrangement to the second side of the vertical stacked arrangement by depositing a suitable electrically conductive material in the first via and in the second via;

wherein a diameter of the electrically conductive filled via at the first side of the vertical stacked arrangement is greater than a diameter of the electrically conductive filled via along an intervening plane of the vertical stacked arrangement, the intervening plane between the first side of the vertical stacked arrangement and the second side of the vertical stacked arrangement; and wherein a diameter of the electrically conductive filled via at the second side of the vertical stacked arrangement is greater than the diameter of the electrically conductive filled via along the intervening plane of the vertical stacked arrangement.

2. The method according to claim 1, wherein the redistribution layer of each of the first semiconductor package, the second semiconductor package, the third semiconductor package, and the fourth semiconductor package extends from over the semiconductor die to over the mold encapsulation structure.

3. The method according to claim 1, wherein the redistribution layer of each of the first semiconductor package, the second semiconductor package, the third semiconductor package, and the fourth semiconductor package comprises one or more electrically conductive lines.

4. The method according to claim 1, wherein the one or more electrically conductive lines of each of the first semiconductor package, the second semiconductor package, the third semiconductor package, and the fourth semiconductor package are in electrical connection with the electrically conductive filled via.

5. The method according to claim 1, wherein forming the first via comprises laser drilling the mold portion at the first side of the vertical stacked arrangement.

6. The method according to claim 1, wherein forming the second via comprises laser drilling the mold portion at the second side of the vertical stacked arrangement.

7. The method according to claim 1, wherein the electrically conductive filled via comprises a first tapered portion extending from the first side of the vertical stacked arrangement to the intervening plane of the vertical stacked arrangement; and wherein the electrically conductive filled via comprises a second tapered portion extending from the second side of the vertical stacked arrangement to the intervening plane of the vertical stacked arrangement.

8. The method according to claim 1, wherein the suitable electrically conductive material is deposited in the first via and the second via by electroplating.

9. A semiconductor packaging structure comprising:
a vertical stacked arrangement comprising a first semiconductor package, a second semiconductor package, a third semiconductor package, and a fourth semiconductor package, each of the first semiconductor package, the second semiconductor package, the third semiconductor package, and the fourth semiconductor package comprising a semiconductor die, a mold encapsulation structure covering at least a portion of the semiconductor die, and a redistribution layer over the semiconductor die;
a first adhesive layer in contact with a bottom side of the second semiconductor package and also in contact with the redistribution layer of the first semiconductor package so that the first adhesive layer adheres the first semiconductor package to the second semiconductor package;
a second adhesive layer in contact with a bottom side of the third semiconductor package and also in contact with the redistribution layer of the second semiconductor package so that the second adhesive layer adheres the second semiconductor package to the third semiconductor package; and
a third adhesive layer in contact with a bottom side of the fourth semiconductor package and also in contact with the redistribution layer of the third semiconductor package so that the third adhesive layer adheres the third semiconductor package to the fourth semiconductor package;
wherein the vertical stacked arrangement comprises a mold portion comprising a plurality of mold encapsulation structures, the mold portion extending from a first side of the vertical stacked arrangement to a second side of the vertical stacked arrangement opposite the first side;
wherein the mold portion comprises an electrically conductive filled via extending through the mold portion from the first side of the vertical stacked arrangement to the second side of the vertical stacked arrangement, the electrically conductive filled via comprising a suitable electrically conductive material in a first via and a second via, the second via meeting the first via to form a continuous through mold via;
wherein a diameter of the electrically conductive filled via at the first side of the vertical stacked arrangement is greater than a diameter of the electrically conductive filled via along an intervening plane of the vertical stacked arrangement, the intervening plane between the first side of the vertical stacked arrangement and the second side of the vertical stacked arrangement; and
wherein a diameter of the electrically conductive filled via at the second side of the vertical stacked arrangement is greater than the diameter of the electrically conductive filled via along the intervening plane of the vertical stacked arrangement.

10. The semiconductor packaging structure according to claim 9, wherein the redistribution layer of each of the first semiconductor package, the second semiconductor package, the third semiconductor package, and the fourth semiconductor package extends from over the semiconductor die to over the mold encapsulation structure.

11. The semiconductor packaging structure according to claim 9, wherein the redistribution layer of each of the first semiconductor package, the second semiconductor package, the third semiconductor package, and the fourth semiconductor package comprises one or more electrically conductive lines.

12. The semiconductor packaging structure according to claim 9, wherein the one or more electrically conductive lines of each of the first semiconductor package, the second semiconductor package, the third semiconductor package, and the fourth semiconductor package are in electrical connection with the electrically conductive filled via.

13. The semiconductor packaging structure according to claim 9, wherein the intervening plane of the vertical stacked arrangement, the first side of the vertical stacked arrangement, and the second side of the vertical stacked arrangement are substantially parallel to one another.

14. The semiconductor packaging structure according to claim 9, wherein the electrically conductive filled via comprises a first tapered portion extending from the first side of the vertical stacked arrangement to the intervening plane of the vertical stacked arrangement; and wherein the electrically conductive filled via comprises a second tapered portion extending from the second side of the vertical stacked arrangement to the intervening plane of the vertical stacked arrangement.

15. The semiconductor packaging structure according to claim 9, wherein the suitable electrically conductive material is copper.

* * * * *